United States Patent
Shin et al.

(10) Patent No.: US 8,421,224 B2
(45) Date of Patent: Apr. 16, 2013

(54) SEMICONDUCTOR CHIP HAVING DOUBLE BUMP STRUCTURE AND SMART CARD INCLUDING THE SAME

(75) Inventors: Seung-hyun Shin, Seongnam-si (KR); Dong-yoon Sun, Seongnam-si (KR)

(73) Assignee: Samsung Electronics Co., Ltd., Gyeonggi-Do (KR)

( * ) Notice: Subject to any disclaimer, the term of this patent is extended or adjusted under 35 U.S.C. 154(b) by 91 days.

(21) Appl. No.: 12/986,801

(22) Filed: Jan. 7, 2011

(65) Prior Publication Data

US 2011/0233545 A1   Sep. 29, 2011

(30) Foreign Application Priority Data

Mar. 29, 2010   (KR) .................. 10-2010-0028089

(51) Int. Cl.
*G06K 19/077* (2006.01)
*H01L 23/58* (2006.01)
*H01L 23/488* (2006.01)

(52) U.S. Cl.
USPC ............. 257/737; 257/48; 257/679; 257/778; 257/780; 257/782; 257/E23.002; 257/E23.023

(58) Field of Classification Search .................... 257/48, 257/679, 737, 778, 780, 782, E23.023, E23.002
See application file for complete search history.

(56) References Cited

U.S. PATENT DOCUMENTS

| 6,879,258 B2 * | 4/2005 | Kuroda et al. ............. 340/572.1 |
| 7,465,654 B2 | 12/2008 | Chou et al. |
| 2003/0214795 A1 * | 11/2003 | Sakuyama ................... 361/767 |
| 2005/0224991 A1 * | 10/2005 | Yeo .............................. 257/781 |
| 2006/0019490 A1 | 1/2006 | Chou et al. |

FOREIGN PATENT DOCUMENTS

| JP | 07201865 A | 8/1995 |
| JP | 2002261111 A | 9/2002 |
| KR | 20050098694 A | 10/2005 |

* cited by examiner

*Primary Examiner* — Peniel M Gumedzoe
(74) *Attorney, Agent, or Firm* — Harness, Dickey & Pierce, P.L.C.

(57) ABSTRACT

Provided is a semiconductor chip having a double bump structure. The semiconductor chip may include a semiconductor substrate, a circuit region on a surface of the semiconductor substrate, a pad on the semiconductor substrate and connected to the circuit region, a first bump on the pad, and a second bump on the first bump. The second bump may be arranged at one side of an upper surface of the first bump and the upper surface of the first bump may include a test area configured to interface with a probe tip, wherein the test area is an area of the upper surface of the first bump exposed by the second bump.

18 Claims, 6 Drawing Sheets

SEMICONDUCTOR CHIP HAVING DOUBLE BUMP STRUCTURE AND SMART CARD INCLUDING THE SAME

CROSS-REFERENCE TO RELATED APPLICATIONS

This application claims priority under 35 U.S.C. §119 to Korean Patent Application No. 10-2010-0028089, filed on Mar. 29, 2010, in the Korean Intellectual Property Office (KIPO), the disclosure of which is incorporated herein in its entirety by reference.

BACKGROUND

1. Field

Example embodiments relate to a semiconductor chip and a smart card including the same, and more particularly, to a semiconductor chip electrically connected to an electronic substrate via an anisotropic conductive film (ACF) and a smart card including the semiconductor chip.

2. Background

In general, a semiconductor chip is electrically connected to an electronic substrate, for example, to a printed-circuit board (PCB) or a smart card, via wires. However, a bump formed in a semiconductor chip may be directly attached to a connecting terminal formed in the PCB. For example, in a smart card and a liquid crystal display (LCD), the bump of the semiconductor chip is connected to the electronic substrate via an ACF instead of a wire.

However, before such semiconductor chips are installed in electronic devices, the semiconductor chips need to be checked whether they operate normally or not by using automatic test equipment (ATE). In general, an electrical function test is performed on a semiconductor device, that is, a semiconductor chip, by connecting a probe tip or a needle to a pad of the semiconductor chip or to a bump formed on the pad in an electronic die sorting test (EDS).

SUMMARY

Example embodiments provide a semiconductor chip having a double bump structure capable of allowing an electrical test to be effectively performed and a semiconductor package for assembly in a semiconductor device. In example embodiments, the double bump structure may connect the semiconductor chip to an electronic substrate via an anisotropic conductive film (ACF).

Example embodiments also provide a smart card including the semiconductor chip having the double bump structure. The double bump structure may allow an electrical test to be effectively performed on the semiconductor chip and may allow the semiconductor chip to be assembled in a semiconductor device (for example, the smart card). In example embodiments, the double bump structure may connect the semiconductor chip to an electronic substrate via an ACF.

In accordance with example embodiments, a semiconductor chip may have a double bump structure. In example embodiments, the semiconductor chip may include a semiconductor substrate, a circuit region on a surface of the semiconductor substrate, a pad on the semiconductor substrate and connected to the circuit region, a first bump on the pad, and a second bump on the first bump. In example embodiments, the second bump may be arranged at one side of an upper surface of the first bump, and the upper surface of the first bump may include a test area configured to interface with a probe tip. In example embodiments the test area may be an area of the upper surface of the first bump exposed by the second bump.

In accordance with example embodiments, a semiconductor chip may have a double bump structure. In example embodiments, the semiconductor chip may include a semiconductor substrate, a pad on a surface of the semiconductor substrate, a passivation layer exposing a part of the pad and covering the semiconductor substrate, a first bump directly on the pad, and a second bump on the first bump. In example embodiments, the second bump may have a width less than that of the first bump.

In accordance with example embodiments, a method of testing a semiconductor device may include providing a semiconductor chip having a bump assembly, the bump assembly may include a first bump on a semiconductor substrate and a second bump on the first bump. In example embodiments, the first bump may include a test area exposed by the second semiconductor chip. In example embodiments, the method may further include contacting a test probe to the test area to test the semiconductor chip.

In accordance with example embodiments a semiconductor chip may have a double bump structure. In example embodiments, the semiconductor chip may include a semiconductor substrate, a circuit region formed on a surface of the semiconductor substrate, a pad connected to the circuit region on the surface of the semiconductor substrate, a testing bump including a first bump that is connected to the pad and exposed by a passivation layer, and a bump assembly including the first bump. In example embodiments, a second bump may be formed on a part of the first bump at one side of a surface of the first bump, and a space may be formed where a probe tip may contact the first bump, wherein the space may be formed on the first bump in an area where the second bump is not formed.

The first bump and the second bump may be formed of gold (Au).

The bump assembly may include a terminal for performing a transmitting/receiving function. The bump assembly of the semiconductor chip may be mounted in a substrate for an electronic device via an anisotropic conductive film (ACF).

The electronic substrate may be a smart card. The electronic substrate may be a glass substrate.

The bump assembly of the pad may be formed on each of pads formed in four corner parts of the semiconductor chip. The first bump may extend symmetrically in left and right directions, compared to the pad. The first bump may extend asymmetrically in left and right directions, compared to the pad.

A height of the second bump may be in the range of about 3 to about 20 μm. A width of the second bump may be greater than a diameter of a conductive ball in the ACF. The space where the probe tip may contact the first bump may be in the range of about 1.5 to about 4 times of a diameter of the probe tip.

Example embodiments also provide a smart card including a semiconductor chip having a double bump structure, the smart card may include a smart card substrate including a printed circuit pattern, a semiconductor chip connected to the smart card substrate via an ACF, and a sealing portion for sealing the smart card substrate and the semiconductor chip. In example embodiments a pad of the semiconductor chip may include a testing bump including a first bump that is connected to the pad and exposed by a passivation layer and a bump assembly including the first bump, a second bump that is formed on a part of the first bump at one side on a surface of the first bump, and a space where a probe tip may contact the first bump, wherein the space is formed on the first bump in an area where the second bump is not formed.

The semiconductor chip may be electrically connected to the smart card substrate via the bump assembly. The smart card may further include a radio frequency (RF) antenna installed in the smart card substrate. The RF antenna may be connected to an RF transmitting/receiving terminal of the bump assembly through a trace of the smart card.

The first bump and the second bump may be formed of gold (Au), but may be formed of a metal material including at least one selected from the group consisting of copper (Cu), silver (Ag), tin (Sn), and aluminum (Al). The bump assembly may be formed on each of pads formed in four corner parts of the semiconductor chip. A width of the second bump may be greater than a diameter of a conductive ball in the ACF. The space where the probe tip may contact the first bump is in the range of about 1.5 to about 4 times of a diameter of the probe tip.

BRIEF DESCRIPTION OF THE DRAWINGS

Example embodiments will be more clearly understood from the following detailed description taken in conjunction with the accompanying drawings in which.

DETAILED DESCRIPTION OF EXAMPLE EMBODIMENTS

Example embodiments will be described with reference to accompanying drawings.

Although a few example embodiments are shown and described, it would be appreciated by those of ordinary skill in the art that changes may be made in these example embodiments without departing from the principles and spirit of example embodiments, the scope of which is defined in the claims and their equivalents.

It will be understood that when an element or layer is referred to as being "on" another element or layer, the element or layer can be directly on another element or layer or intervening elements or layers. In contrast, when an element is referred to as being "directly on" another element or layer, there are no intervening elements or layers present. Like numbers refer to like elements throughout. As used herein, the term "and/or" includes any and all combinations of one or more of the associated listed items.

The terminology used herein is for the purpose of describing particular embodiments only and is not intended to be limiting of the invention. As used herein, the singular forms "a", "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

It will be understood that, although the terms first, second, third, etc., may be used herein to describe various elements, components, regions, layers and/or sections, these elements, components, regions, layers and/or sections should not be limited by these terms. These terms are only used to distinguish one element, component, region, layer or section from another region, layer or section. Thus, a first element, component, region, layer or section discussed below could be termed a second element, component, region, layer or section without departing from the teachings of example embodiments.

Example embodiments are described herein with reference to cross-section illustrations that are schematic illustrations of example embodiments (and intermediate structures) of inventive concepts. As such, variations from the shapes of the illustrations as a result, for example, of manufacturing techniques and/or tolerances, are to be expected. Thus, example embodiments should not be construed as limited to the particular shapes of regions illustrated herein but are to include deviations in shapes that result, for example, from manufacturing.

In the present specification, terminologies such as wafer and substrate may denote a semiconductor layer on a base structure such as silicon, silicon-on-insulator (SOI), or silicon-on-sapphire (SOS), doped or undoped semiconductor layer, and transformed semiconductor layer. In addition, the terminologies of wafer and substrate are not limited to the silicon-based material, and may denote group III-V semiconductor material such as silicon-germanium, germanium, or gallium-arsenic compound material.

Hereinafter, example embodiments will be described in detail with reference to the attached drawings. Example embodiments are provided so that this disclosure will be thorough and complete, and will fully convey the scope of the inventive concepts to those of ordinary skill in the art. In example embodiments, a terminal and a bump are represented at the same position. However, when an electrical contact is described, the term "terminal" is used, and when a structure is described, the term "bump" is used.

Figure 1:
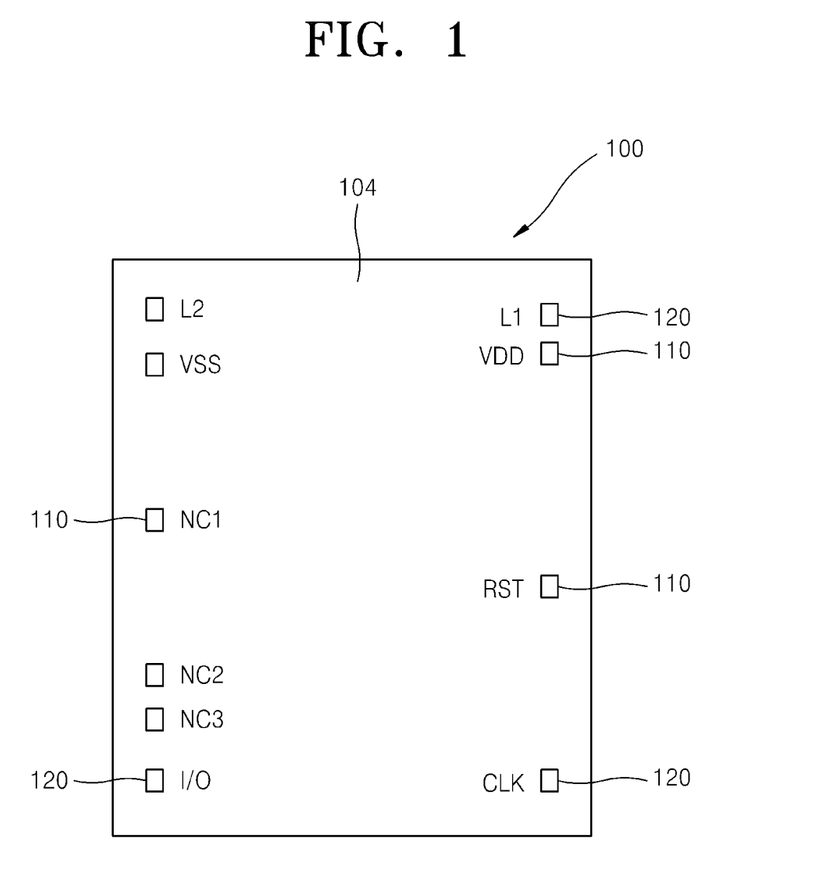
FIG. 1 is a plan view illustrating a semiconductor chip having a double bump structure, according to example embodiments.

FIG. 1 is a plan view illustrating a semiconductor chip 100 having a double bump structure, according to example embodiments.

Referring to FIG. 1, the semiconductor chip 100 having a double bump structure may include a semiconductor substrate 102 (see FIG. 2) and a circuit region 104 formed on a surface of the semiconductor substrate. The circuit region 104 may be configured to perform various functions. For example, the circuit region 104 may be configured to perform any function selected from the group consisting of an LSI function, a LOGIC function, a controller function, and a processor function.

The semiconductor chip 100 may include a pad 106 (see FIG. 2) connected to the circuit region 104 formed on the surface of the semiconductor substrate. The semiconductor chip 100 may include a testing bump 110 connected to a passivation layer 108 and having only a first bump 112 exposed outside of the passivation layer 108. In the semiconductor chip 100 of FIG. 1, the testing bump 110 may include a VSS terminal, a VDD terminal, NC1 through NC3 terminals, and an RST terminal.

The semiconductor chip 100 may include a second bump, for example, a bump assembly 120 that may be connected to the pad 106 and may be exposed outside the passivation layer 108.

Figure 3:
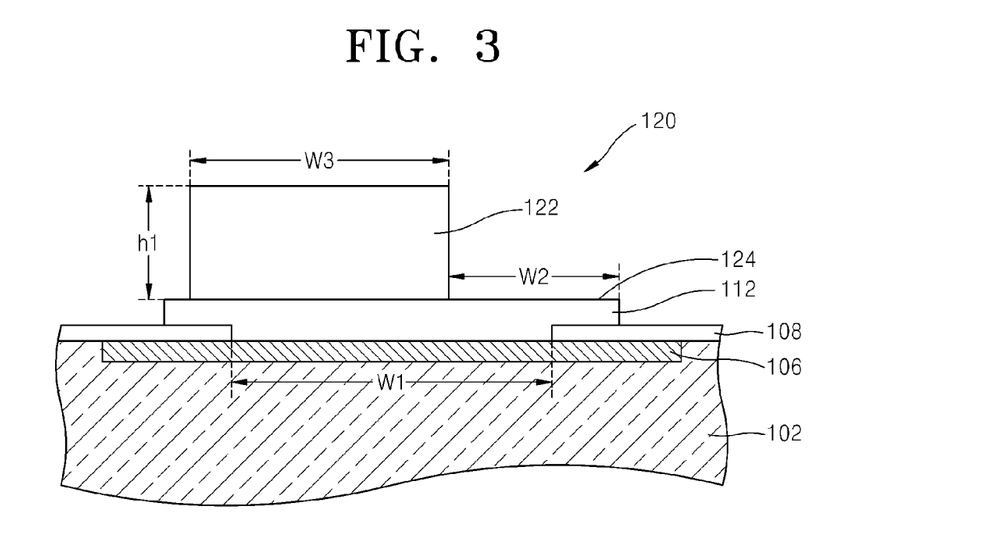
FIG. 3 is a cross-sectional view for explaining a structure of a bump assembly in the semiconductor chip having a double bump structure of FIG. 1, according to example embodiments.

The bump assembly 120 may include the first bump 112 and a second bump 122 (see FIG. 3) that is at least partially formed on the first bump 112. In example embodiments the second bump 122 may be formed at one side of an upper surface 124 of the first bump 112. In example embodiments, a portion of the upper surface 124 of the first bump 112 may be exposed by the second bump 122. In example embodiments, the portion of the upper surface 124 of the first bump 112 (see FIG. 3) that is exposed by the second bump 122 may provide a surface to which a probe tip may contact the first bump 112. In example embodiments, the portion of the upper surface 124 of the first bump that provides the surface for probe tip contact corresponds to a portion of the upper surface 124 of the first bump 112 where the second bump 122 is not formed. This portion, for example, may correspond to the region having the width W2 as shown in FIG. 3 and this portion may be referred to as a test area.

The bump assembly 120 may be formed in each of four corner parts of semiconductor chip 100, and thus may form a radio frequency (RF) transmitting/receiving terminal like an L1 and an L2 of FIG. 1. In FIG. 1, although an I/O terminal and a CLK terminal may not be RF transmitting/receiving terminals, the second bump 122 may be formed therein. As such, the dummy-shaped second bump 122 may be formed in the I/O terminal and the CLK terminal in order to balance the four corner parts of the semiconductor chip 100.

Figure 2:
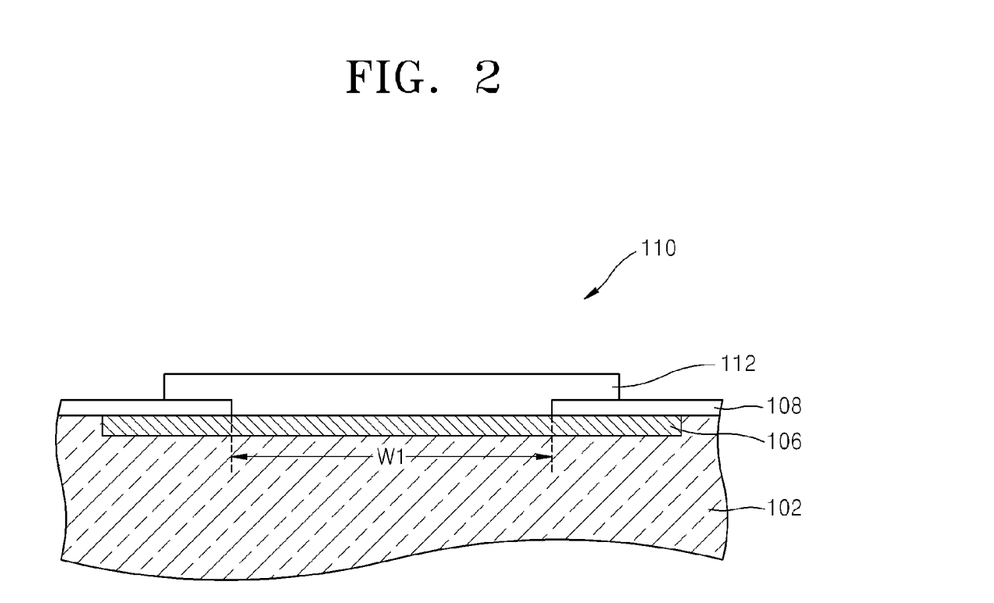
FIG. 2 is a cross-sectional view for explaining a structure of a testing bump in the semiconductor chip having a double bump structure, according to example embodiments.

FIG. 2 is a cross-sectional view for explaining a structure of a testing bump 110 in the semiconductor chip 100 having a double bump structure, according to example embodiments.

FIG. 2 illustrates a cross-section of the testing bump 110 on the pad 106 connected to a circuit region (not shown) of the semiconductor substrate 102. In general, the semiconductor chip 100 may be protected by a passivation layer 108, for example, a nitride layer formed of a rigid material, and the pad 106 may be exposed to the outside by etching a part of the passivation layer 108. As illustrated in FIG. 2, the pad 106, which may have an exposed width W1, may be connected to the first bump 112. The first bump 112 may be used to perform an electrical test of the semiconductor chip 100 and may be used as a path or structure through which a wire or bump may be connected when the semiconductor chip 100 is packaged into a semiconductor package. The testing bump 110 may include the first bump 112 that is connected to the pad 106 formed of gold (Au) and is exposed by the passivation layer 108. Although the pad has been described as being formed of gold (Au), example embodiments are not limited thereto as the pad may be formed of other conductive materials.

The first bump 112 may be formed of a conductive material, for example, Gold (Au). In example embodiments the first bump 112 may be utilized as a terminal for performing an electrical test, that is, as the testing bump 110, in a subsequent process. The first and second bumps 112 and 122 may be formed of a conductive material, for example, a metal. In example embodiments the first and second bumps 112 and 122 may be formed of a metal including at least one selected from the group consisting of copper (Cu), silver (Ag), tin (Sn) and aluminum (Al). Although not shown in FIG. 2, when the first bump 112 is formed on the pad 106, an under bump metallurgy (UBM) layer may be formed between the pad 106 and the first bump 112. In general, the UBM layer may include a barrier layer and a seed layer, wherein the seed layer may be formed on the barrier layer. Also, the UBM layer may be formed in other various forms.

FIG. 3 is a cross-sectional view for explaining a structure of a bump assembly in the semiconductor chip 100 having a double bump structure of FIG. 1, according to example embodiments.

Referring to FIG. 3, the bump assembly 120 of the semiconductor chip 100 may include the testing bump 110 (see FIG. 2), which only includes the first bump 112 of FIG. 2, and the second bump 122. In example embodiments, the second bump 122 may be formed of Au, however, example embodiments are not limited thereto as other conductive materials may be used to form the second bump 122. The bump assembly 120 may be higher than the testing bump 110 (see FIG. 2) by a height h1, which corresponds to the height of the second bump 122. Accordingly, after an electrical test on the semiconductor chip 100 is finished, the semiconductor chip 100 may be installed in a substrate for an electronic device via the height of the second bump 122. The substrate for an electronic device may be a glass substrate used in a smart card or a liquid crystal display (LCD) device. The height h1 of the second bump 122 may be in the range of about 3 to about 20 μm, so that when the semiconductor chip 100 is installed in the substrate for an electronic device in a subsequent process, the height h1 may be greater than a minimum diameter of a conductive ball included in an anisotropic conductive film (ACF) and also is in the range to arrange one to about three conductive balls in one row.

In example embodiments, the second bump 122 may be formed at one side on the upper surface 124 of the first bump 112 as illustrated in FIG. 3. Accordingly, the portion of the upper surface 124 where a probe tip (not shown) may contact the first bump 112 may correspond to an area where the second bump 122 is not formed. A width W2 corresponding to the portion of the upper surface space 124 where a probe tip may contact may be in the range of about 1.5 to about 4 times of the probe tip used in an electrical function test. Even if an arrangement error on the probe tip occurs in a probe card used in an electrical test for a wafer, the width W2 is defined to compensate for the arrangement error.

A width W3 of an upper part of the second bump 122 may be in the range of about 2 to about 10 μm, so that when the semiconductor chip 100 is installed in a substrate for an electronic device, the width W3 may be greater than a minimum diameter of a conductive ball included in an ACF used as an adhesive. Accordingly, a minimum space for securing conductivity between the semiconductor chip 100 and the substrate for an electronic device may be formed along the width W3 of the second bump 122. Although not shown in FIG. 3, a UBM layer may be additionally formed between the pad 106 and the first bump 112, and the UBM layer may include a lower barrier layer and an upper seed layer.

Figure 4:
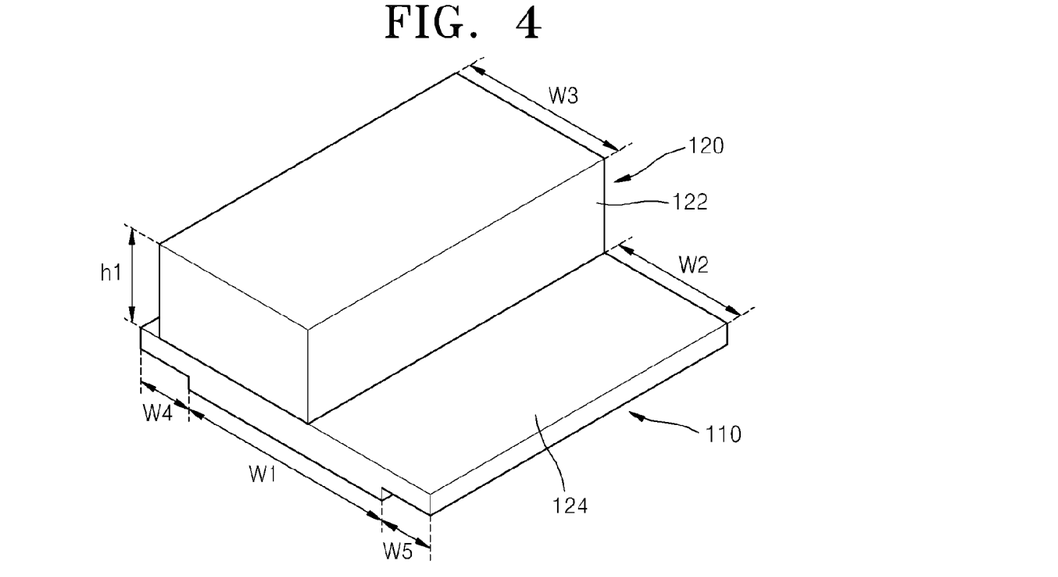
FIG. 4 is a perspective view for explaining a structure of the bump assembly in the semiconductor chip having a double bump structure of FIG. 3.

FIG. 4 is a perspective view for explaining a structure of the bump assembly 120 in the semiconductor chip 100 having a double bump structure of FIG. 1.

Referring to FIG. 4, the bump assembly 120 may have a structure in which left and right widths W4 and W5 of the first bump 110 extend symmetrically in left and right directions, compared to the width W1 of the exposed portion of the pad 106. Although the width W3 of the second bump 122 is smaller than the width (W4+W1+W5) of the first bump 110, the structure of the bump assembly 120 may be effectively employed when a problem does not occur in a packaging process, that is, an assembling process of a chip on card (COC) package or a chip on glass (COG) package.

Accordingly, the width W3 of the second bump 122 may be as small as possible within a range greater than a diameter of the conductive ball used for the ACF. Thus, the portion of the area of the upper surface 124 (the portion corresponding to width W2) where the probe tip may contact the first bump 110 may be formed as wide as possible on the first bump 110. The area of the upper surface 124 of the first bump 112 where the probe tip may contact the first bump 110 (corresponding to the width W2) may be in the range of about 1.5 to about 4 times of a diameter of the probe tip.

Figure 5:
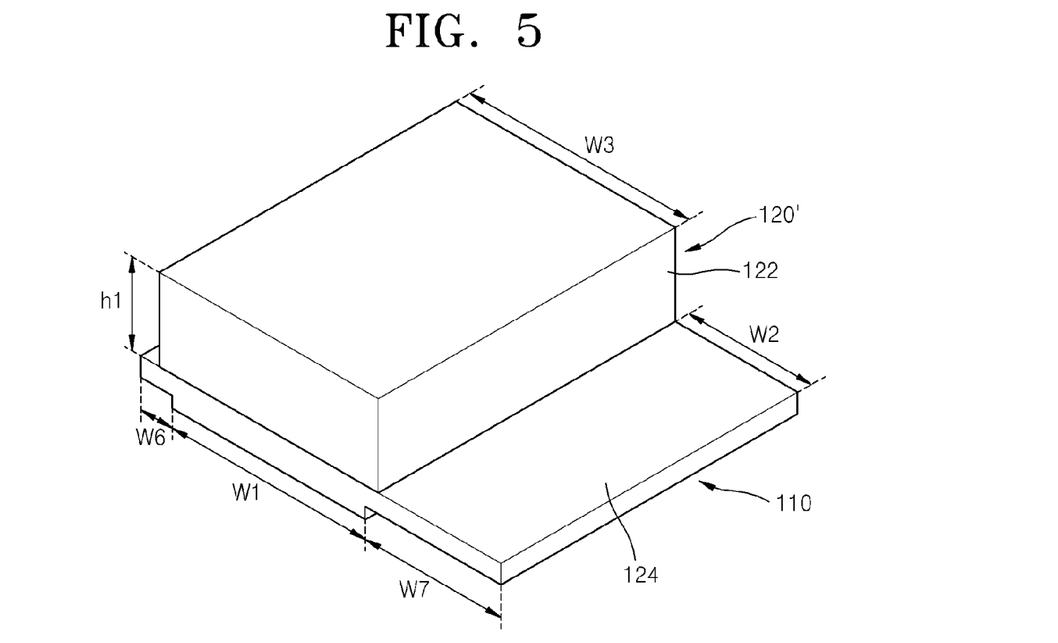
FIG. 5 is a perspective view for explaining a bump assembly in the semiconductor chip having a double bump structure of FIG. 3, according to example embodiments.

FIG. 5 is a perspective view for explaining a bump assembly 120' in the semiconductor chip 100 having a double bump structure of FIG. 1, according to example embodiments.

Referring to FIG. 5, a modified bump assembly 120' may have a structure in which left and right widths W6 and W7 of the first bump 110 extend asymmetrically in left and right directions, compared to the width W1 of the exposed portion of the pad 106. When the width W3 of the second bump 122 is small, the structure of the modified bump assembly 120' may be effectively employed when a problem occurs in assembling of a COC package or a COG package. Accordingly, the width W3 of the second bump 122 may be sufficiently wide, compared to the width W1 of the pad. The portion of the top surface 124 of the first bump (the width W2) where the probe tip may contact the first bump 110 may be lengthened on the first bump 110 by further extending the first bump 110 asymmetrically to the right side. In example embodiments, the portion of the top surface 124 of the first bump (the width W2) where the probe tip may contact the first bump 110 may be in the range of about 1.5 to about 4 times of a diameter of the probe tip.

Figure 6:
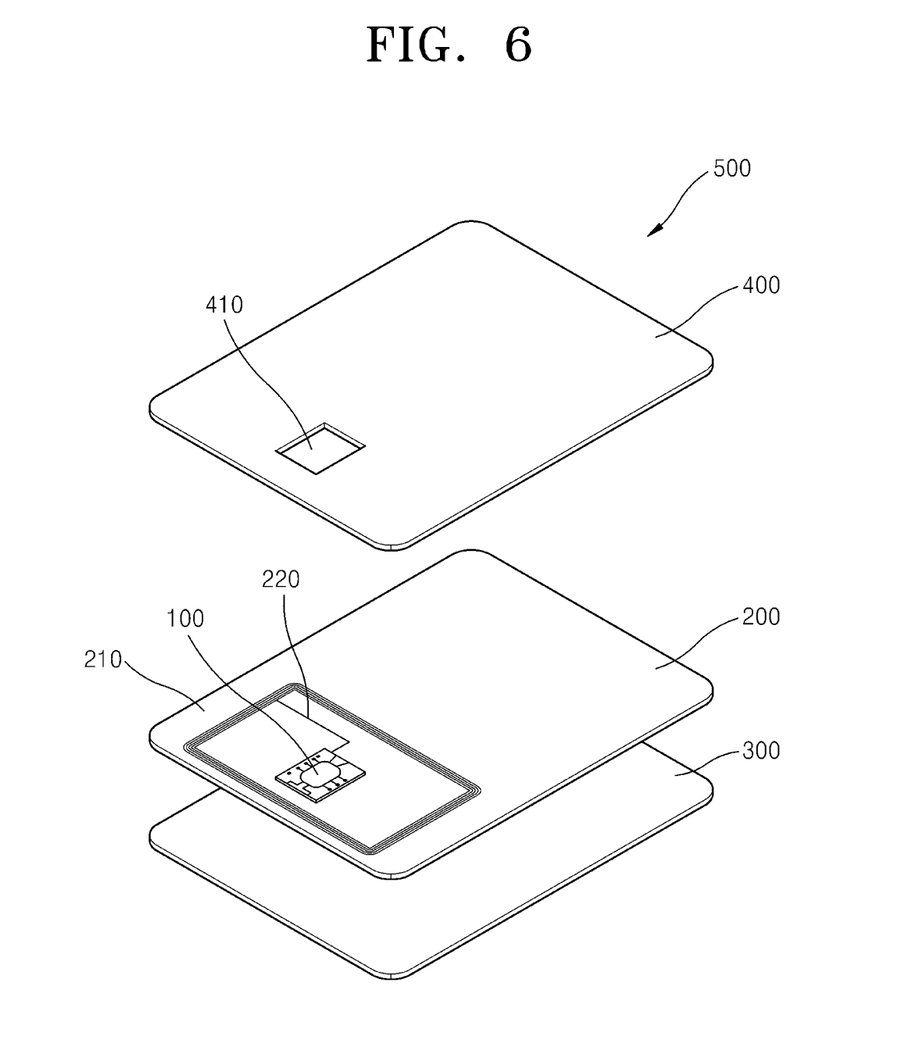
FIG. 6 is a perspective view for explaining a smart card including a semiconductor chip having a double bump structure, according to example embodiments.

FIG. 6 is a perspective view for explaining a smart card 500 including the semiconductor chip 100 having a double bump structure, which was described with reference to FIGS. 1 through 5, according to example embodiments.

Referring to FIG. 6, the smart card 500 including the semiconductor chip 100 may include a smart card substrate 200 including a printed circuit pattern 220. In example embodiments, the semiconductor chip 100 may be connected to the smart card substrate 200 by using an ACF.

In detail, a pad of the semiconductor chip 100 may include the testing bump 110 (see FIG. 2) having only the first bump that is connected to the pad and is exposed by the passivation layer, the second bump, and the bump assembly 120 (see FIG. 3) having an exposed surface where the probe tip may contact the first bump, wherein the exposed surface is formed on the first bump in an area where the second bump is not formed. Furthermore, when the semiconductor chip 100 is connected to the smart card substrate 200, only the bump assembly 120 may be electrically connected to the smart card substrate 200, and the testing bump 110 may not be electrically connected thereto.

The smart card 500 including the semiconductor chip 100 may include sealing portions 300 and 400 for sealing the smart card substrate 200 and the semiconductor chip 100. The sealing portions 300 and 400 may be a lower printed circuit board (PCB) 300 and an upper PCB 400, respectively, and may be have various shapes for protecting the smart card substrate 200 from an external impact or environmental agents. Reference numeral 410 denotes a window that may expose a bottom surface of the semiconductor chip 100 to the outside. However, the window for exposing a bottom surface of the semiconductor chip 100 to the outside may not be formed.

The smart card 500 including the semiconductor chip 100 may further include a radio frequency (RF) antenna 210 formed in the smart card substrate 200. The RF antenna 210 may be connected to a RF transmitting/receiving terminal of the semiconductor chip 100 via the printed circuit pattern 220 formed in the smart card substrate 200. FIG. 6 describes mainly installation of the semiconductor chip 100 on the smart card substrate 200. However, the semiconductor chip 100 may also be connected to a substrate for an electronic device, for example, glass, used in an LCD by using an ACF.

Figure 7:
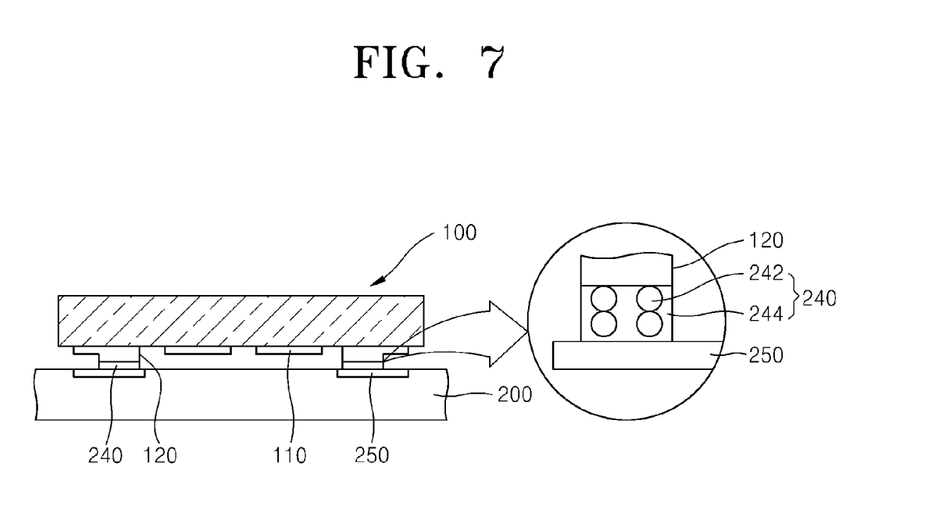
FIG. 7 is a cross-sectional view for explaining installation of a semiconductor chip having a double bump structure on a smart card, according to example embodiments.

FIG. 7 is a cross-sectional view for explaining installation of the semiconductor chip 100 having a double bump structure on the smart card 500, according to example embodiments.

Referring to FIG. 7, the semiconductor chip 100 having a double bump structure may be connected to the smart card substrate 200. The semiconductor chip 100 may be connected to the smart card substrate 200 so that a circuit region is downward. In the semiconductor chip 100, a testing bump 110 may not be connected to the smart card substrate 200, and the bump assembly 120 may only be connected to the smart card substrate 200. As described above, a terminal for performing an RF transmitting/receiving function in the bump assembly 120 may be electrically connected to an RF that is additionally formed in the smart card substrate 200.

As illustrated in an enlarged part of FIG. 7, the bump assembly 120 may be electrically connected to a connecting terminal 250 formed in the smart card substrate 200 via an ACF 240. The ACF 240 may include a plurality of conductive balls 242 and an insulator 244. The ACF 240 may have a structure which is conductive only in a vertical direction and not in a horizontal direction. In example embodiments, the conductive ball 242 of the ACF 240 may have a diameter of from about 4 to about 10 µm, and an ACF including a conductive ball may have a diameter of 2 µm.

Figure 8:
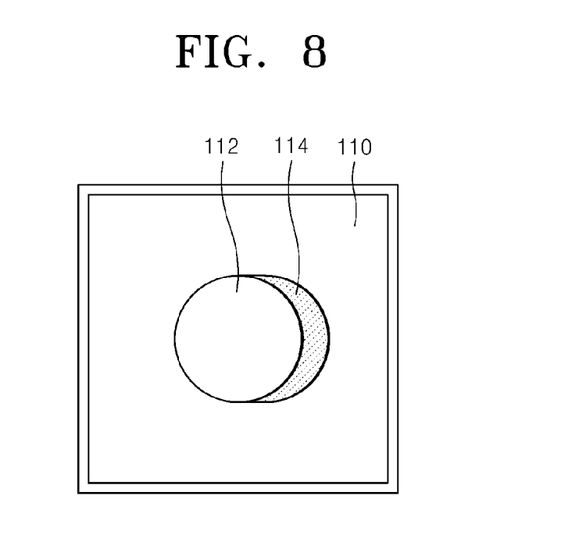
FIG. 8 is a plan view illustrating a contact between a testing bump and a probe tip, according to example embodiments.
Figure 9:
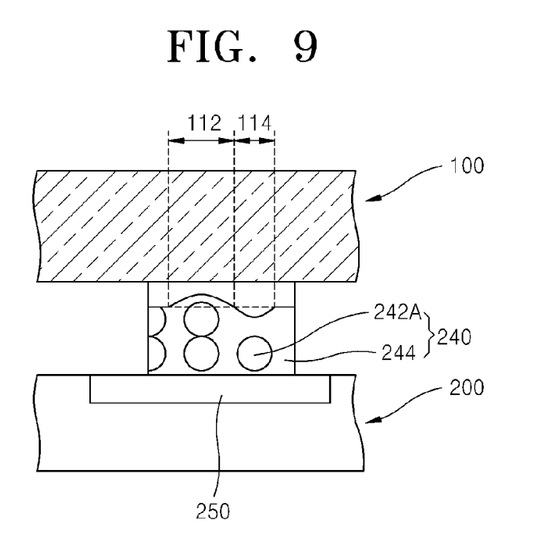
FIG. 9 is a cross-sectional view illustrating attachment of a semiconductor chip to an electronic substrate by using an anisotropic conductive film (ACF) as the testing bump of FIG. 8, according to example embodiments.

FIG. 8 is a plan view illustrating a contact between a testing bump and a probe tip, according to example embodiments. FIG. 9 is a cross-sectional view illustrating attachment between a semiconductor chip and a substrate for an electronic device by using an ACF as the testing bump of FIG. 8, according to example embodiments.

Referring to FIGS. 8 and 9, the first bump 110 may be formed in a manufacturing process of a wafer and an electrical test may be performed using an apparatus configured to perform an electrical function test of a wafer. In example embodiments the probe tip included in a probe card presses the first bump 110 with a force strong enough to form an electrical connection. Thus, a print 112 may be formed by the probe tip and the print 112 may remain on a surface of the first bump 110. In example embodiments, the probe tip may press the first bump 110 from left to right, and thus a part of the surface of the first bump 110 may be uplifted at the right side of the print 112, thereby generating an uplifted part 114. Thus, as illustrated in FIG. 9, the print 112 formed by the probe tip may be engraved in the surface of the first bump 110 and the uplifted part 114 may be uplifted, and thus, the first bump 110 may have a surface with low flatness.

Thus, two conductive balls 242 of the ACF 240 may be arranged in the print 112 formed by the probe tip, and only one conductive ball 242 may be disposed in the uplifted part 114. Accordingly, an electrical connection between the semiconductor chip 100 and the smart card substrate 200 may not performed smoothly in the uplifted part 114. In example embodiments, in order to solve such a problem, as described in FIGS. 3 through 5, the bump assemblys 120 and 120' are additionally formed so as to increase flatness of an interface between the semiconductor chip 100 and the smart card substrate 200.

According to example embodiments, in a semiconductor chip for a COC or COG, a testing bump for an electrical test of a wafer and an assembling pad for assembling a semiconductor device are additionally formed so as to realize a stable connection between a probe tip and a bump assembly in an electronic die sorting test (EDS) of a wafer and to prevent breakdown of a probe card. In addition, the semiconductor chip can be stably and electrically connected to a substrate for an electronic device by using an ACF.

While the inventive concepts have been particularly shown and described with reference to example embodiments thereof, it will be understood that various changes in form and details may be made therein without departing from the spirit and scope of the following claims.

What is claimed is:

1. A semiconductor chip having a double bump structure, the semiconductor chip comprising:
a semiconductor substrate;
a circuit region on a surface of the semiconductor substrate;
a pad on the semiconductor substrate and connected to the circuit region;
a first bump on the pad; and
a second bump on the first bump, the second bump disposed asymmetrically relative to two opposite sides of the first bump, the second bump being arranged at one side of an upper surface of the first bump, the upper surface of the first bump including a test area configured to interface with a probe tip, wherein the test area is an area of the upper surface of the first bump exposed by the second bump, a width of the test area being in the range of about 1.5 to about 4.5 times of a diameter of the probe tip.

2. The semiconductor chip of claim 1, wherein the first bump and the second bump include gold (Au).

3. The semiconductor chip of claim 1, wherein the first bump and the second bump form a bump assembly the bump assembly configured to transmit/receive signals.

4. The semiconductor chip of claim 1, further comprising:
an anisotropic conductive film (ACF) configured to attach at least one of the first bump and the second bump to a substrate of an electronic device.

5. The semiconductor chip of claim 1, further comprising a passivation layer exposing the pad.

6. The semiconductor chip of claim 5, wherein the passivation layer extends between the first bump and the pad.

7. The semiconductor chip of claim 1, wherein the pad is arranged at one of a corner and an edge of the semiconductor chip.

8. The semiconductor chip of claim 1, wherein the first bump extends symmetrically in left and right directions with respect to the pad.

9. The semiconductor chip of claim 1, wherein the first bump extends asymmetrically in left and right directions with respect to the pad.

10. The semiconductor chip of claim 1, wherein a height of the second bump is about 3 to about 20 μm.

11. The semiconductor chip of claim 1, further comprising:
an anisotropic conductive film (ACF) configured to attach at least one of the first bump and the second bump to a substrate of an electronic device and a width of the second bump is greater than a diameter of a conductive ball in the ACF.

12. A semiconductor chip having a double bump structure, the semiconductor chip comprising:
a semiconductor substrate;
a pad on a surface of the semiconductor substrate;
a passivation layer exposing a part of the pad and covering the semiconductor substrate;
a first bump directly on the pad; and
a second bump on the first bump, the second bump disposed asymmetrically relative to two opposite sides of the first bump, the second bump having a width less than that of the first bump, wherein an area of an upper surface of the first bump exposed by the second bump provides a test area configured to interface with a probe tip, a width of the test area being in the range of about 1.5 to about 4.5 times of a diameter of the probe tip.

13. A smart card comprising:
a smart card substrate comprising a printed circuit pattern;
the semiconductor chip of claim 1 connected to the smart card substrate via an ACF; and
a sealing portion for sealing the smart card substrate and the semiconductor chip.

14. The smart card of claim 13, wherein the semiconductor chip is electrically connected to the smart card substrate via the first and second bumps.

15. The smart card of claim 13, further comprising:
a radio frequency (RF) antenna in the smart card substrate.

16. The smart card of claim 13, wherein the RF antenna is connected to a bump assembly through a trace of the smart card, the bump assembly including the first bump and the second bump and configured to transmit/receive signals.

17. The smart card of claim 13, wherein the semiconductor chip includes at least one corner part and the pad is in the at least one corner part.

18. The smart card of claim 13, wherein a width of the second bump is greater than a diameter of a conductive ball in the ACF.

* * * * *